(12) United States Patent
Hsieh et al.

(10) Patent No.: US 8,270,444 B2
(45) Date of Patent: Sep. 18, 2012

(54) SIDE EMITTING SEMICONDUCTOR PACKAGE (75) Inventors: Min-Tsun Hsieh, Taipei (TW);
Wen-Liang Tseng, Taipei (TW);
Lung-Hsin Chen, Taipei (TW);
Chih-Yung Lin, Taipei (TW)

(73) Assignee: Advanced Optoelectronics Technology, Inc., Hsinchu Hsien (TW)

( * ) Notice: Subject to any disclaimer, the term of this patent is extended or adjusted under 35 U.S.C. 154(b) by 139 days.

(21) Appl. No.: 12/900,676

(22) Filed: Oct. 8, 2010

(65) Prior Publication Data
US 2011/0206079 A1  Aug. 25, 2011

(30) Foreign Application Priority Data

Feb. 24, 2010  (TW) .............................. 99105297 A (51) Int. Cl.
*H01S 3/00* (2006.01)
*H01L 33/00* (2010.01)

(52) U.S. Cl. ............................. 372/38.1; 257/88; 257/99
(58) Field of Classification Search .................... 257/88, 257/98–99, 685–686, 723–724; 372/38.1
See application file for complete search history.

(56) References Cited

U.S. PATENT DOCUMENTS

| 7,262,440 B2 * | 8/2007 | Choi et al. ..................... 257/99 |
| 7,808,013 B2 * | 10/2010 | Mendendorp et al. .......... 257/99 |
| 2004/0239242 A1 * | 12/2004 | Mano et al. .................. 313/512 |
| 2005/0189557 A1 * | 9/2005 | Mazzochette et al. ........ 257/100 |

FOREIGN PATENT DOCUMENTS

TW   200826324   6/2008

* cited by examiner

*Primary Examiner* — Jessica Stultz
*Assistant Examiner* — Phillip Nguyen
(74) *Attorney, Agent, or Firm* — Altis Law Group, Inc.

(57) ABSTRACT

A side emitting semiconductor package includes a two-sided electric circuit formed on a silicon substrate of the package, and a plurality of semiconductor light emitting devices bonded on two bilateral surfaces of the electric circuit to provide a surface mounted device with two light emitting sides.

17 Claims, 8 Drawing Sheets

SIDE EMITTING SEMICONDUCTOR PACKAGE

BACKGROUND

1. Technical Field

The disclosure relates generally to semiconductor technology, and more particularly to a side emitting semiconductor package.

2. Description of the Related Art

With progress in semiconductor light emitting device development, light emitting diodes (LEDs), organic light emitting diodes (OLEDs), and laser diodes (LDs) are becoming increasingly popular, due to longer lifetimes, lower power consumption, less heat generation, and compact size. Generally, the semiconductor light emitting devices are surface mounted devices (SMDs) for providing all kinds of industries. The semiconductor light emitting devices dissipate heat via constructions of polyphthalamide (PPA), polypropylene (PP), polycarbonate (PC) or polymethylmethacrylate (PMMA). These materials have low thermal conductivity between 0.1 and 0.22 W/M-k and reduce lifetime of the devices.

What is need, therefore, is a side emitting semiconductor package which can overcome the described limitations.

DETAILED DESCRIPTION

The disclosure provides a side emitting semiconductor package, comprising a silicon substrate and a specific electric circuit. A plurality of semiconductor light emitting devices is formed on bilateral sides of the silicon substrate to provide a surface mounted device (SMD) with two light emitting sides. Moreover both of the two light emitting sides are flat, therefore the side emitting semiconductor package has two far light fields.

Exemplary embodiments of the disclosure are now described with reference to the accompanying drawings.

The disclosure provides a first embodiment of a side emitting semiconductor package 1, as shown in FIGS. 1 to 4, comprising a silicon substrate 10, at least one first semiconductor device 11, at least one second semiconductor device 12 and an electric circuit 13. The silicon substrate 10 comprises a first surface 101, a second surface 102 and a third surface 103, wherein the first surface 101 and the second surface 102 are flat planes respectively formed on oppositely lateral sides of the silicon substrate 10. Two ends of the third surface 103 respectively connect to the first surface 101 and the second surface 102. Moreover, the first surface 101 and the second surface 102 are light emitting surfaces for the side emitting semiconductor package 1. The third surface 103 is a bottom surface by which the side emitting semiconductor package 1 electrically connects to an external circuit (not shown).

Figure 1:
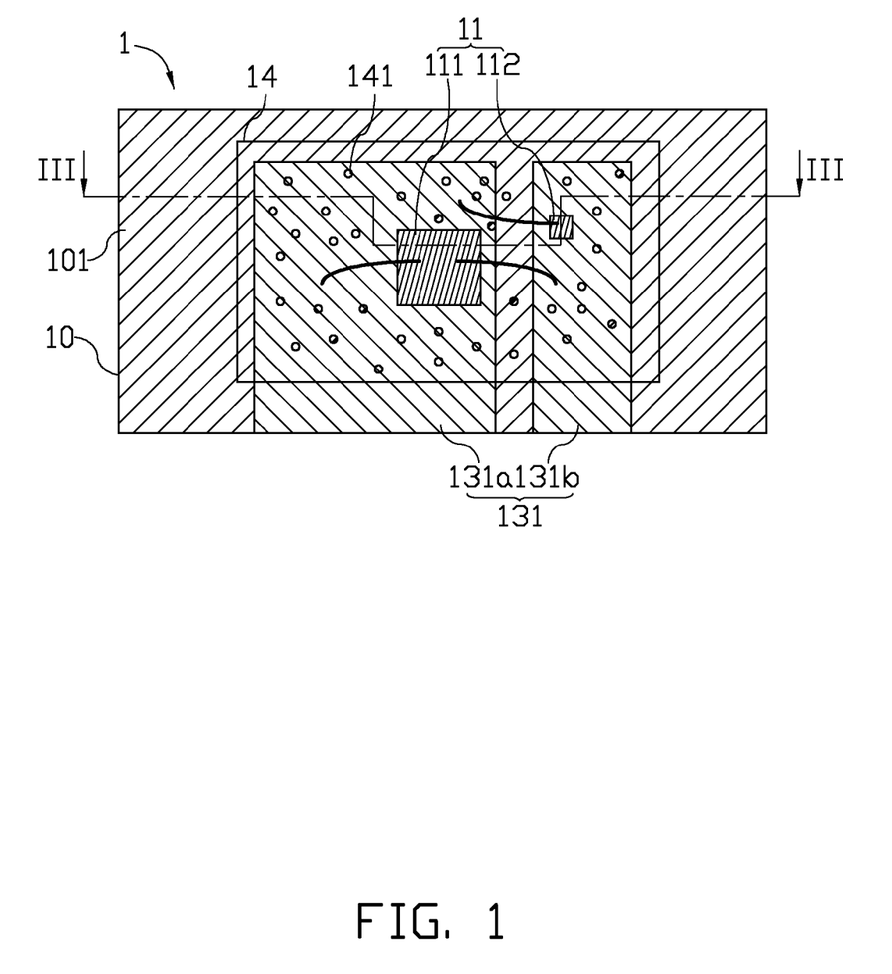
FIG. 1 is a top view of a side emitting semiconductor package in accordance with a first embodiment of the disclosure.
Figure 2:
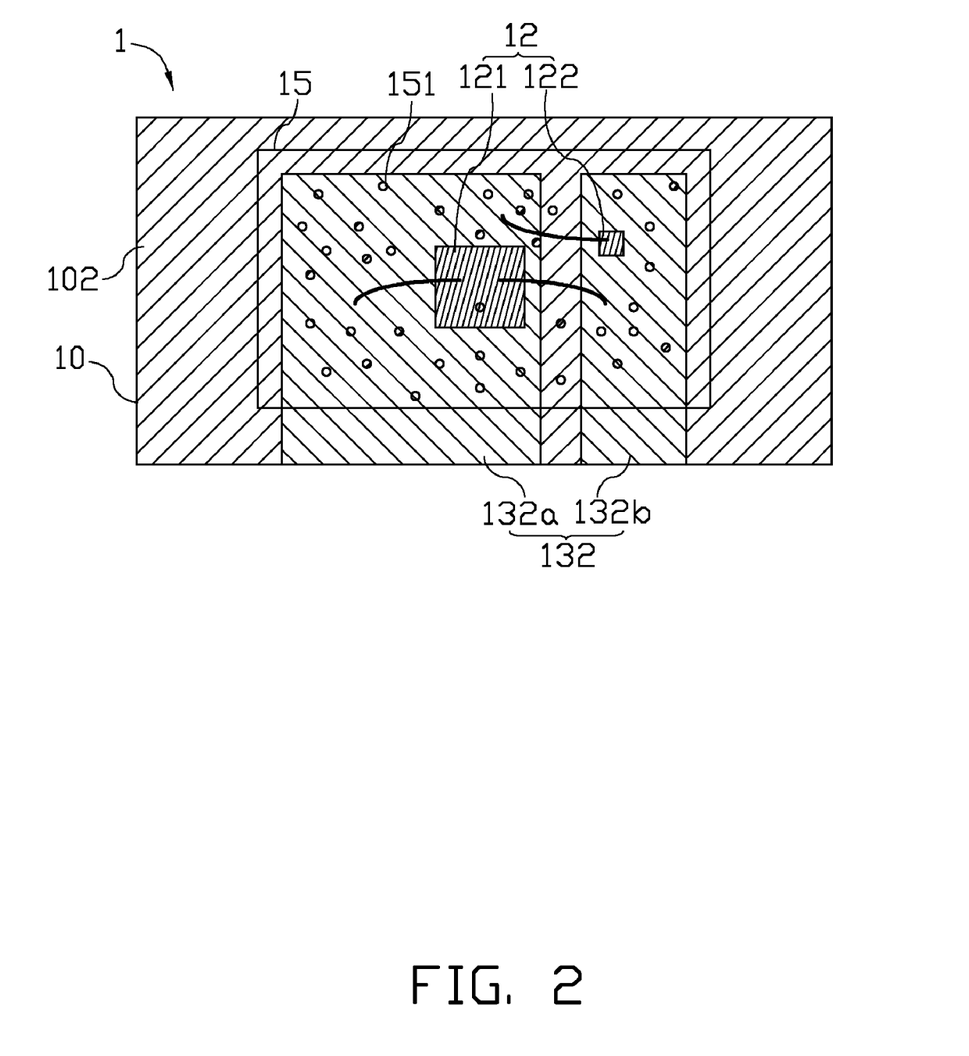
FIG. 2 is a bottom view of the side emitting semiconductor package in accordance with the first embodiment of the disclosure.
Figure 3:
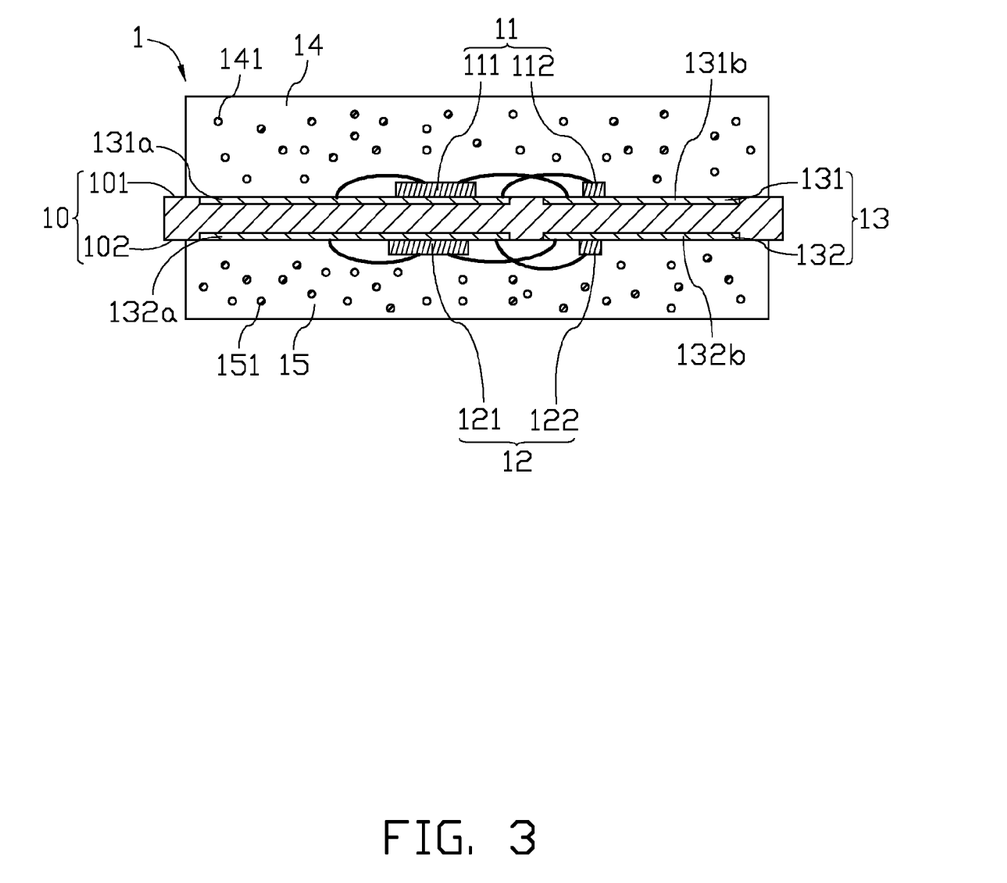
FIG. 3 is a cross section taken along line III-III of FIG. 1.
Figure 4:
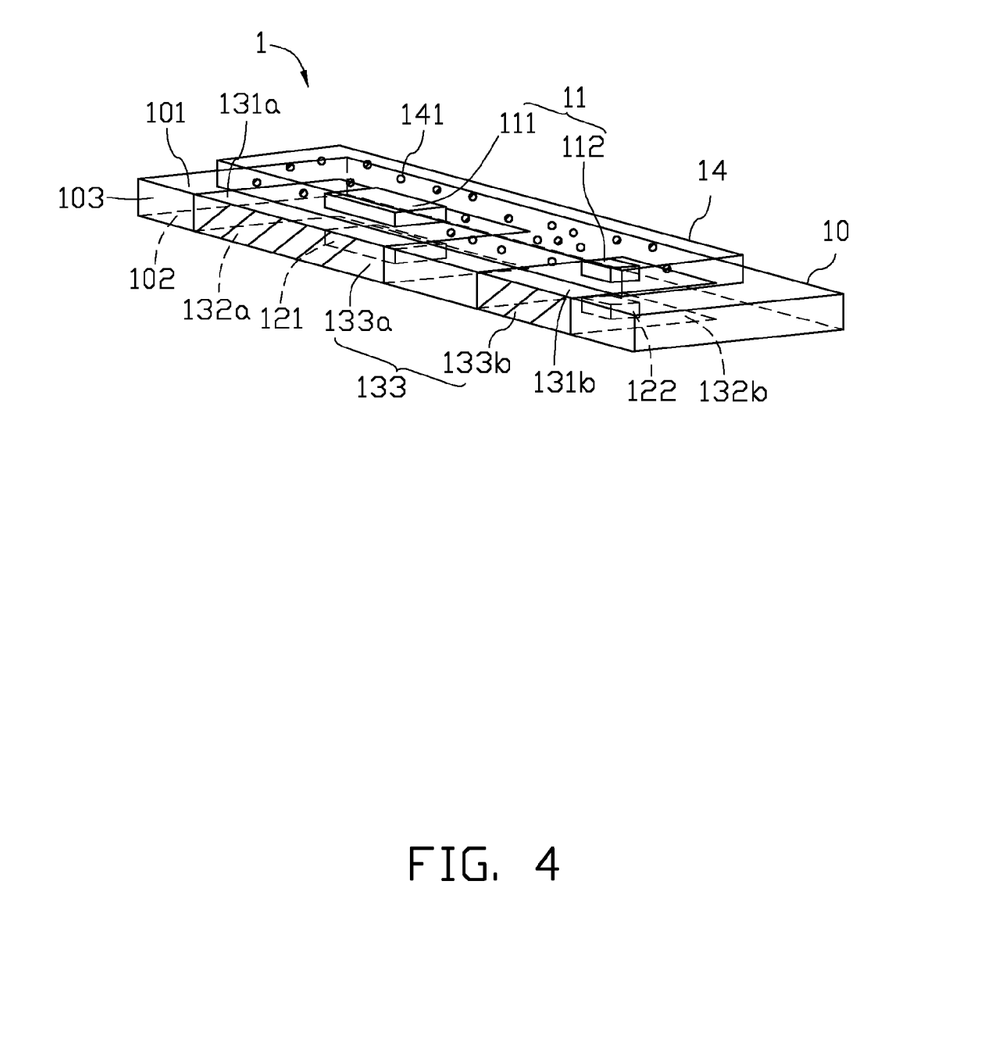
FIG. 4 is a perspective view of the side emitting semiconductor package in accordance with the first embodiment of the disclosure.

As shown in FIGS. 1 to 4, the electric circuit 13 comprises a first circuit 131, a second circuit 132 and a third circuit 133. Referring to FIGS. 1 and 3, the first circuit 131 is allocated on the first surface 101 of the silicon substrate 10, wherein the first circuit 131 comprises a first carrier 131*a* and a first connection 131*b*. The first carrier 131*a* and the first connection 131*b* are electrically insulated from each other. Referring to FIGS. 2 and 3, the second circuit 132 is allocated on the second surface 102 of the silicon substrate 10, wherein the second circuit 132 comprises a second carrier 132*a* and a second connection 132*b*. The second carrier 132*a* and the second connection 132*b* are electrically insulated from each other. Referring to FIG. 4, the third circuit 133 is allocated on the third surface 103 of the silicon substrate 10, wherein the third circuit 133 comprises a third connection 133*a* and a fourth connection 133*b*. The third connection 133*a* and the fourth connection 133*b* are electrically insulated from each other. Furthermore, the first carrier 131*a* electrically connects to the second carrier 132*a* through the third connection 133*a*, and the first connection 131*b* electrically connects to the second connection 132*b* through the fourth connection 133*b*. In the present embodiment, the third connection 133*a* and the fourth connection 133*b* are allocated on the third surface 103, i.e., a bottom surface of the side emitting semiconductor package 1 providing electrical connection to an external circuit (not shown). Accordingly, the side emitting semiconductor package 1 provided by the disclosure is a surface mounted device. However, those skilled in the art can understand that the electric circuit 13 is not restricted to that shown in FIGS. 1 and 2, but can be any specific structure sufficient to the same purpose. Additionally, the electric circuit 13 is copper, nickel, or any conductive metal.

In the disclosure, as shown in FIGS. 1 and 3, the at least one first semiconductor device 11 comprises a first light emitting device 111 and a first Zener diode 112. The first light emitting device 111 is allocated on the first carrier 131*a* and electrically connects to the first connection 131*b* by wire bonding. The first light emitting device 111 emits light with at least one wavelength such as ultraviolet, blue light, green light or multiple wavelengths. In the disclosure, the first light emitting device 111 is a light emitting diode, laser diode or any semiconductor light emitting device. Additionally, the first light emitting device 111 is a III-V group or II-VI group compound semiconductor. However, those skilled in the art can understand that the first light emitting device 111 can include multiple devices. Moreover, the first Zener diode 112 is allocated on the first connection 131*b* and electrically connects to the first carrier 131*a* by wire bonding. The first Zener diode 112 protects the first light emitting device 111 from damage from any impulse.

In the disclosure, as shown in FIGS. 2 and 3, the at least one second semiconductor device 12 comprises a second light emitting device 121 and a second Zener diode 122. The second light emitting device 121 is allocated on the second carrier 132*a* and electrically connects to the second connection 132*b* by wire bonding. Similarly, the second light emitting device 121 and the first light emitting device 111 are the same component. However, those skilled in the art can understand that the second light emitting device 121 can include multiple devices. Moreover, the second Zener diode 122 is allocated on the second connection 132b and electrically connects to the second carrier 132a by wire bonding. The second Zener diode 122 protects the second light emitting device 121 from damage from any impulse.

Figure 5:
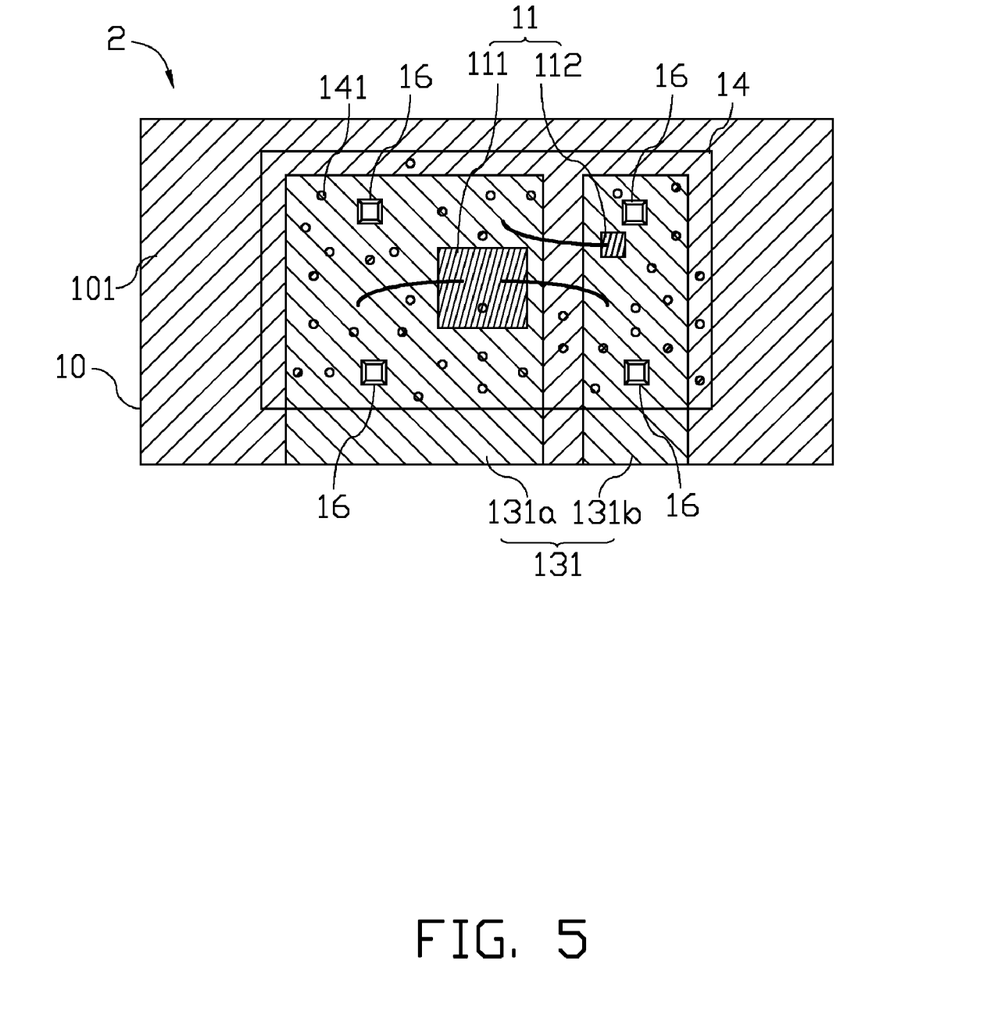
FIG. 5 is a top view of a side emitting semiconductor package in accordance with a second embodiment of the disclosure.
Figure 6:
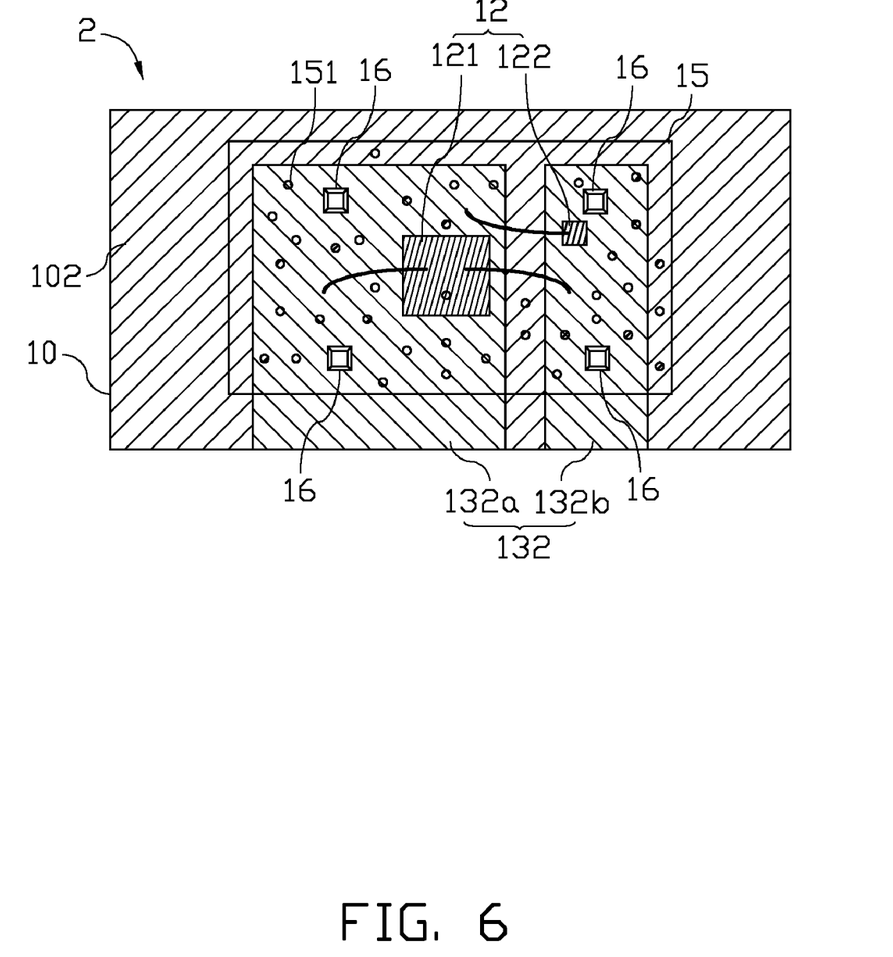
FIG. 6 is a bottom view of the side emitting semiconductor package in accordance with the second embodiment of the disclosure.
Figure 7:
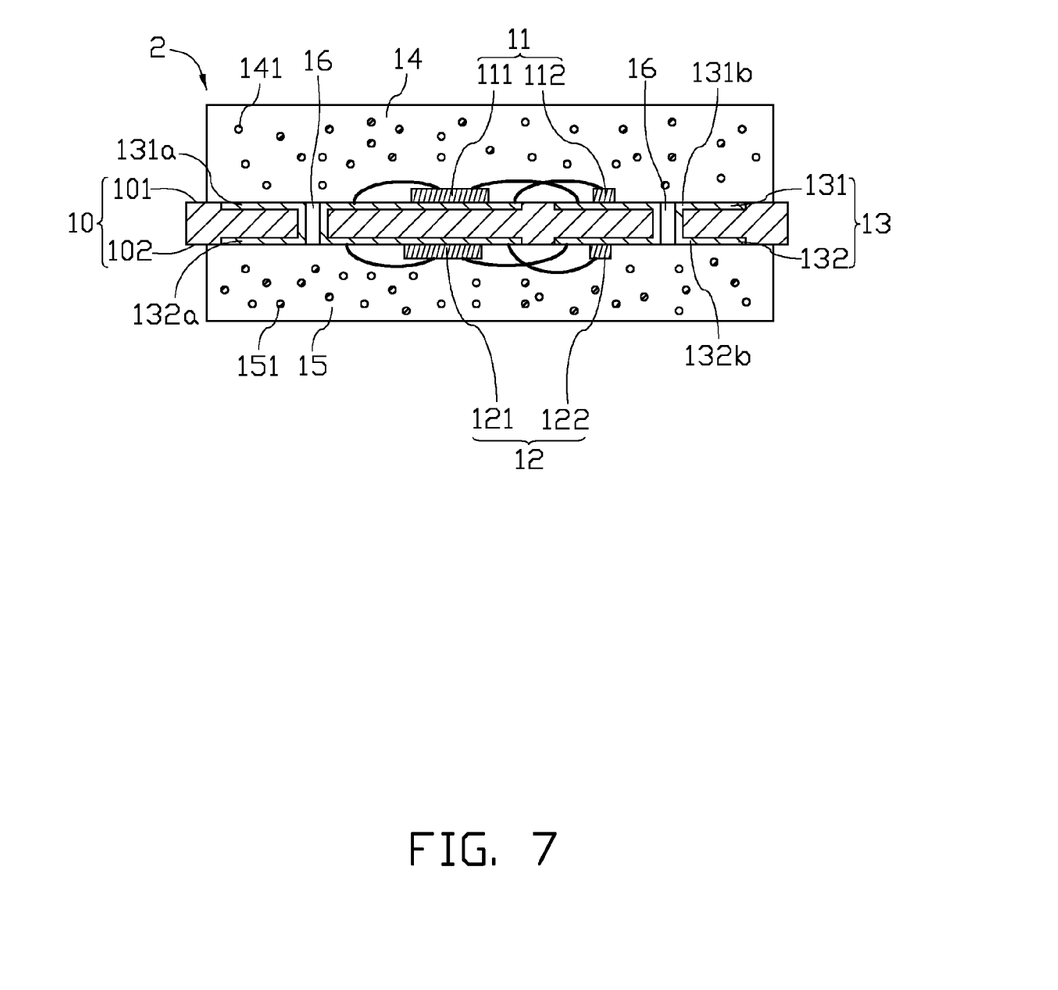
FIG. 7 is a cross section taken alone line VII-VII of FIG. 5.

The disclosure provides a second embodiment of a side emitting semiconductor package 2, as shown in FIGS. 5 to 7, differing from the first embodiment only in the presence of a plurality of through holes 16 passing through the first surface 101 to the second surface 102, through which the first circuit 131 electrically connects to the second circuit 132. More specifically, the first carrier 131a of the first circuit 131 electrically connects to the second carrier 132a of the second circuit 132 via the through holes 16 and the first connection 131b of the first circuit 131 electrically connects to the second connection 132b of the second circuit 132 via the through holes 16. Accordingly, the first circuit 131 and the second circuit 132 of the side emitting semiconductor package 2 may electrically connect each other without requiring the third circuit 133.

Figure 8:
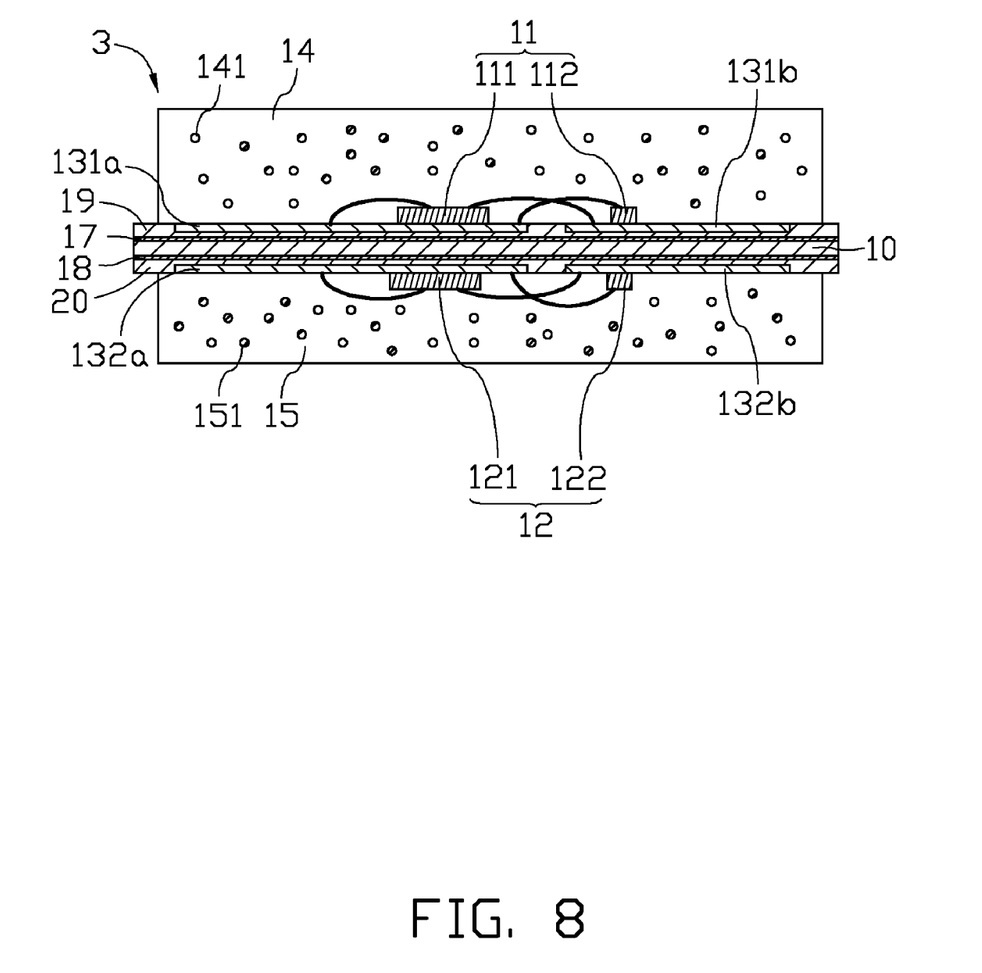
FIG. 8 is a cross section of a side emitting semiconductor package in accordance with a third embodiment of the disclosure.

To improve light extraction efficiency of the side emitting semiconductor packages 1, 2, a plurality of reflective structures is formed on the surfaces of the silicon substrate 10 as shown in FIG. 8. Accordingly, a first reflective layer 17 is allocated on the silicon substrate 10 and under the first circuit 131, whereby reflective efficiency of the silicon substrate 10 and light extraction efficiency of the first light emitting device 111 are enhanced and a second reflective layer 18 is allocated on the silicon substrate 10 and under the second circuit 132, whereby reflective efficiency of the silicon substrate 10 and light extraction efficiency of the second light emitting device 121 are enhanced. In the present embodiment, the first reflective layer 17 and the second reflective layer 18 are aluminum, silver, gold or tin. To prevent electrical connection of the first carrier 131a and the first connection 131b, a first insulating layer 19 is allocated on the first reflective layer 17 and under the first circuit 131. Similarly, to prevent electrical connection of the second carrier 132a and the second connection 132b, a second insulating layer 20 is allocated on the second reflective layer 18 and under the second circuit 132. In the embodiment of the disclosure, the first insulating layer 19 and the second insulating layer 20 are silicon oxide (SiO) or silicon nitride (SiN). Moreover, the first insulating layer 19 may extend to the second insulating layer 20 through the plurality of through holes 16, such that current within the first circuit 131 leaking into the silicon substrate 10 can be avoided if the first circuit 131 upon the first surface 101 extends to the second surface 102 also through the through holes 16 as the second embodiment of the side emitting semiconductor package 2. A third insulating layer (not shown) is allocated between the silicon substrate 10 and the third circuit 133, whereby electrical connection of the silicon substrate 10 and the third circuit 133 is avoided. In the embodiment of the disclosure, the third insulating layer is silicon oxide (SiO) or silicon nitride (SiN).

A plurality of cover layers is allocated to encapsulate the at least one first semiconductor device 11 and the at least one second semiconductor device 12 as shown in FIGS. 1 to 8 to prevent damage or influence by other external factors, such as a first cover layer 14 allocated on the first surface 101 encapsulating the at least one first semiconductor device 11 and a portion of the first circuit 131 and a second cover layer 15 allocated on the second surface 102 encapsulating the at least one second semiconductor device 12 and a portion of the second circuit 132. In the embodiment of the disclosure, the first cover layer 14 and the second cover layer 15 are transparent material such as silicone, glass, epoxy, or combination thereof.

Accordingly, when the first cover layer 14 and the second cover layer 15 respectively comprise at least one first luminescent conversion element 141 and at least one second luminescent conversion element 151, the at least one first luminescent conversion element 141 is able to convert light emitted from the first light emitting device 111 to different wavelengths, and the at least one second luminescent conversion element 151 is able to convert light emitted from the second light emitting device 121 to different wavelengths. In the embodiment of the disclosure, the at least one first luminescent conversion element 141 and the at least one second luminescent conversion element 151 are YAG, TAG, silicate, nitride, nitrogen oxides, phosphide, sulfide or combination thereof.

According to the disclosure, the side emitting semiconductor package provides two flat light emitting sides and is able, accordingly, to emit two far light fields with no requirement for multiple devices that can increase packaging cost, diminish thermal dissipation, and impact compactness and versatility.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A side emitting semiconductor package comprising:
a silicon substrate, comprising a first surface, a second surface and a third surface, wherein the first surface and the second surface are flat and respectively formed on opposite sides of the silicon substrate, and two ends of the third surface respectively connect to the first surface and the second surface;
at least one first semiconductor light emitting device, allocated on the first surface of the silicon substrate;
at least one second semiconductor light emitting device, allocated on the second surface of the silicon substrate; and
an electric circuit, formed on the first surface and the second surface and electrically connecting with the at least one first semiconductor light emitting device and the at least one second semiconductor light emitting device, whereby the at least one first semiconductor light emitting device and the at least one second semiconductor light emitting device electrically connect to an external circuit through the electric circuit, wherein the electric circuit comprises:
a first circuit, allocated on the first surface of the silicon substrate, wherein the first circuit comprises a first carrier and a first connection, wherein the first carrier and the first connection are electrically insulated from each other;
a second circuit, allocated on the second surface of the silicon substrate, wherein the second circuit comprises a second carrier and a second connection, wherein the second carrier and the second connection are electrically insulated from each other; and
a third circuit, allocated on the third surface of the silicon substrate;

a first reflective layer, allocated on the silicon substrate and under the first circuit;
a second reflective layer, allocated on the silicon substrate and under the second circuit;
a first insulating layer, allocated on the first reflective layer and under the first circuit;
a second insulating layer, allocated on the second reflective layer and under the second Circuit; and
a third insulating layer, allocated on the silicon substrate and under the third circuit;
wherein, the first surface and the second surface are light emitting surfaces for the side emitting semiconductor package, and the third surface is a bottom surface electrically connecting the side emitting semiconductor package to the external circuit.

2. The side emitting semiconductor package as claimed in claim 1, wherein the third circuit comprises a third connection and a fourth connection, wherein the third connection and the fourth connection are electrically insulated from each other.

3. The side emitting semiconductor package as claimed in claim 2, wherein the first carrier electrically connects to the second carrier through the third connection, and the first connection electrically connects to the second connection through the fourth connection.

4. The side emitting semiconductor package as claimed in claim 1, wherein the silicon substrate further comprises a plurality of through holes penetrating the first surface to the second surface, wherein the first circuit electrically connects to the second circuit through the through holes.

5. The side emitting semiconductor package as claimed in claim 1, wherein the silicon substrate further comprises a plurality of through holes penetrating the first surface to the second surface, wherein the first circuit electrically connects to the second circuit through the through holes, and the first insulating layer extends to the second insulating layer through the through holes.

6. The side emitting semiconductor package as claimed in claim 1, further comprising a first cover layer allocated on the first surface, wherein the first cover layer encapsulates the at least one first semiconductor light emitting device and a portion of the first circuit.

7. The side emitting semiconductor package as claimed in claim 6, further comprising a second cover layer allocated on the second surface, wherein the second cover layer encapsulates the at least one second semiconductor light emitting device and a portion of the second circuit.

8. The side emitting semiconductor package as claimed in claim 7, wherein the first cover layer and the second cover layer each are made of a material selected from the group consisting of silicone, glass, epoxy, and a combination thereof.

9. The side emitting semiconductor package as claimed in claim 6, wherein the first cover layer comprises at least one first luminescent conversion element made of a material selected from the group consisting of YAG, TAG, silicate, nitride, nitrogen oxides, phosphide, sulfide, and a combination thereof.

10. The side emitting semiconductor package as claimed in claim 7, wherein the second cover layer comprises at least one second luminescent conversion element made of a material selected from the group consisting of YAG, TAG, silicate, nitride, nitrogen oxides, phosphide, sulfide, and a combination thereof.

11. The side emitting semiconductor package as claimed in claim 1, wherein the at least one first semiconductor light emitting device and the at least one second semiconductor light emitting device each comprise light emitting diodes, laser diodes or combination thereof.

12. A semiconductor package comprising:
a silicon substrate, comprising a first surface, a second surface and a third surface, wherein the first surface and the second surface are flat and respectively formed on two oppositely lateral sides of the silicon substrate, and two ends of the third surface respectively connect to the first surface and the second surface;
at least one first semiconductor light emitting device and at least one second semiconductor light emitting device, respectively allocated on the first surface and the second surface; and
an electric circuit, formed on the silicon substrate, comprising:
a first circuit, allocated on the first surface, comprising a first carrier and a first connection, wherein the first carrier and the first connection are electrically insulated from each other;
a second circuit, allocated on the second surface, comprising a second carrier and a second connection, wherein the second carrier and the second connection are electrically insulated from each other; and
a third circuit, allocated on the third surface and configured for electrically connecting with an external circuit, comprising a third connection and a fourth connection, wherein the third connection and the fourth connection are electrically insulated from each other;
a first reflective layer, allocated on the silicon substrate and under the first circuit;
a second reflective layer, allocated on the silicon substrate and under the second circuit;
a first insulating layer, allocated on the first reflective layer and under the first circuit;
a second insulating layer, allocated on the second reflective layer and under the second circuit; and
a third insulating layer, allocated on the silicon substrate and under the third circuit.

13. The semiconductor package as claimed in claim 12, wherein the first carrier electrically connects to the second carrier through the third connection, and the first connection electrically connects to the second connection through the fourth connection.

14. The semiconductor package as claimed in claim 12, wherein the silicon substrate further comprises a plurality of through holes penetrating the first surface to the second surface, wherein the first circuit electrically connects to the second circuit through the through holes.

15. The semiconductor package as claimed in claim 12, further comprising a first cover layer allocated on the first surface and a second cover layer allocated on the second surface, wherein the first cover layer encapsulates the at least one first semiconductor light emitting device and a portion of the first circuit, and the second cover layer encapsulates the at least one second semiconductor light emitting device and a portion of the second circuit.

16. The semiconductor package as claimed in claim 15, wherein the first cover layer and the second cover layer each are made of a material selected from the group consisting of silicone, glass, epoxy, and a combination thereof.

17. The semiconductor package as claimed in claim 16, wherein the first cover layer comprises at least one first luminescent conversion element and the second cover layer comprises at least one second luminescent conversion element, wherein the at least one first luminescent conversion element and the at least one second luminescent conversion element each are made of a material selected from the group consisting of YAG, TAG, silicate, nitride, nitrogen oxides, phosphide, sulfide and a combination thereof.

* * * * *

UNITED STATES PATENT AND TRADEMARK OFFICE
CERTIFICATE OF CORRECTION

PATENT NO. : 8,270,444 B2  
APPLICATION NO. : 12/900676  
DATED : September 18, 2012  
INVENTOR(S) : Min-Tsun Hsieh Page 1 of 1

It is certified that error appears in the above-identified patent and that said Letters Patent is hereby corrected as shown below:

On the title page, please replace Item (73) regarding "Assignees" with the following:

(73) Assignee: Advanced Optoelectronic Technology, Inc., Hsinchu Hsien (TW)

Signed and Sealed this  
Twenty-ninth Day of October, 2013

Teresa Stanek Rea  
*Deputy Director of the United States Patent and Trademark Office*